United States Patent [19]

Levy et al.

[11] Patent Number: 5,659,496
[45] Date of Patent: Aug. 19, 1997

[54] SYSTEM AND METHOD FOR PROGRAMMING VPROM LINKS

[75] Inventors: Paul S. Levy, Chandler; John C. Ciccone, Tempe, both of Ariz.

[73] Assignee: VLSI Technology, Inc., San Jose, Calif.

[21] Appl. No.: 581,646

[22] Filed: Dec. 28, 1995

[51] Int. Cl.$^6$ .................................................. G11C 17/00
[52] U.S. Cl. ..................... 365/96; 365/189.11; 365/225.7; 327/525
[58] Field of Search ........................... 365/96, 225.7, 365/230.01, 189.11; 327/525

[56] References Cited

U.S. PATENT DOCUMENTS 5,469,379  11/1995  Levy ............................................ 365/96
5,526,312   6/1996  Eltonkhy ................................ 365/205.7 X
5,572,458  11/1996  Smith et al. ................................. 365/96

*Primary Examiner*—Do Hyun Yoo
*Attorney, Agent, or Firm*—Harry M. Weiss & Associates

[57] ABSTRACT

The present invention relates to a system and method for programming VROM links. The system has an address selection circuit connected to the VROM link for selecting an address in the VROM link in which to program. A polarity control circuit is also connected to the VROM link. The polarity control circuit allows one to control the directional flow of a current used in programming the VROM link.

10 Claims, 1 Drawing Sheet

| $V_{PP}$ | IN | Q | $\bar{Q}$ |
|---|---|---|---|
| $V_{PP}$ | 0 | 0 | $V_{PP}$ |
| $V_{PP}$ | 1 | $V_{PP}$ | 0 |
| 0 | 0 | 0 | 0 |
| 0 | 1 | 0 | 0 |

SYSTEM AND METHOD FOR PROGRAMMING VPROM LINKS

BACKGROUND OF THE INVENTION

1. Field of the Invention

This invention relates to VROM links and, more specifically, to a system and method for allowing the bi-directional flow of a current for programming the VROM link.

2. Background of the Invention

VROM links are made of an amorphous silicon sandwich (i.e., link). The VROM link has an opening when built which is used for programming the VROM link. At each end of the opening is an electrode. When programming the VROM link, a high voltage is applied across the two electrodes. The high voltage causes an antifuse material to break down at a certain weak point. As a programming current flows through the breakdown spot, it generates a large enough Joule heat to raise the temperature around the breakdown spot above the reaction temperature between the metal electrode and the antifuse layer. A conductive channel (i.e., filament) is formed through the reaction between the metal electrode and the antifuse material shorting one electrode to the other. The conductive channel is actually a core wherein the outside of the core is metal, and the inside of the core is a reaction product of metal and antifuse material. A detailed discussion of antifuses can be seen in "An Electro-Thermal Model For Metal-Oxide-Metal Antifuses," IEEE Transactions On Electron Devices, Vol. 42, No. 8, August 1995, pages 1548–1558.

The programming current is defined as the largest current flow through an antifuse which last at least 10 ns. If the duration of the programming current is shorter than 10 ns, a stable stage will not be reached and no stable conductive link will be formed. The formation geometry of the VROM link is related to the direction of the current flow during programming. In general, the diameter of the filament is fat on one electrode and thin on the opposite electrode. Thus, the programming current is limited to one direction only. Reversing the current during the programming event will have the effect of increasing the thin diameter of the filament. This will allow an increase in the programming yield of the VROM link. Furthermore, since some technologies will use programming voltages less than p-channel breakdown, level shifters can be used to steer the programming voltage instead of the strapped n-channels and charge pumps currently being used. This will allow simplification of the programming circuit.

Therefore, a need existed to provide a system and method for allowing bi-direction current flow during programming of the VROM link thereby increasing the programming yield of the VROM link. The system and method must also simplify the circuit used for programming the VROM link.

SUMMARY OF THE INVENTION

In accordance with one embodiment of the present invention, it is an object of the present invention to increase programming yields of VROM links by providing a system and method for allowing bi-directional current flow for programming the VROM links.

It is another object of the present invention to provide a simplified circuit and method for programming the VROM link.

BRIEF DESCRIPTION OF THE PREFERRED EMBODIMENTS

In accordance with one embodiment of the present invention, a system for programming a VROM link is disclosed. The system is comprised of a programmable VROM link. Address selection means are coupled to the programmable VROM link for selecting an address in the VROM link to program. The address selection means are comprised of level shifter means coupled to each column of the programmable VROM link and to each row of the programmable VROM link for selecting a column and a row in the programmable VROM link in which to program. Polarity control means are coupled to the programmable VROM link for controlling the directional flow of a current used in programming the programmable VROM link. The polarity control means are also comprised of a level shifter means, the level shifter means being used for controlling the directional flow of the current used in programming the programmable VROM link.

In accordance with another embodiment of the present invention, a method for programming a VROM link is disclosed. The method comprises the steps of: providing a programmable VROM link; providing address selection means coupled to the programmable VROM link for selecting an address in the VROM link in which to program; providing polarity control means coupled to the programmable VROM link for controlling the directional flow of a current used in programming the programmable VROM link; selecting an address in the programmable VROM link to program; and selecting directional flow of the current for programming the programmable VROM link. The step of providing address selection means may further comprise the step of providing level shifter means coupled to each column of the programmable VROM link and to each row of the programmable VROM link for selecting a column and a row in the programmable VROM link to program. The step of providing polarity control means may also further comprise the step of providing level shifter means coupled to the programmable VROM link, the level shifter means being used for controlling the directional flow of the current used in programming the programmable VROM link.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
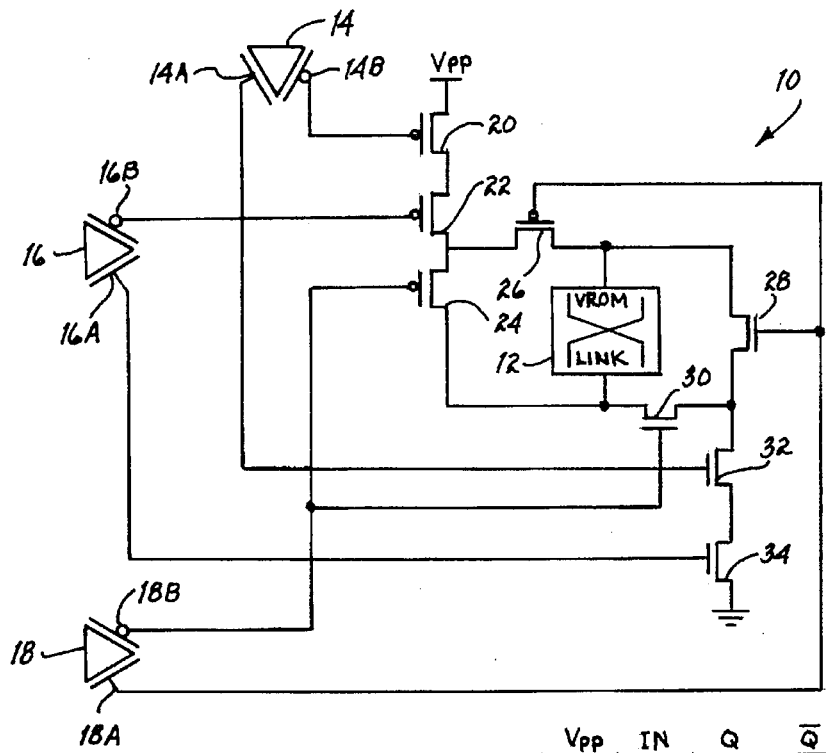
FIG. 1 is a simplified schematic of a circuit used for programming a VROM link.

Referring to FIG. 1, a system 10 for programming a VROM link 12 is shown. The system 10 is comprised of a column selector 14, a row selector 16, a polarity control 18, and transistors 20, 22, 24, 26, 28, 30, 32, and 34.

The column selector 14 has an output 14A coupled to the transistor 32 and an inverted output 14B coupled to the transistor 20. The column selector 14 is used for selecting a column in the programmable VROM link 12 in which to program. Although only one column selector 14 is shown in FIG. 1 for simplicity, it should be noted that each column in the VROM link 12 would be coupled to a column selector 14 in order to determine which column in the VROM link 12 to program.

The row selector 16 has an output 16A coupled to transistor 34 and an inverted output 16B coupled to transistor 22. The row selector 16 is used for selecting a row in the programmable VROM link 12 in which to program. Like the column selector 14, only one row selector 16 is shown in FIG. 1 for simplicity. However, each row in the VROM link 12 would be coupled to a row selector 16 in order to determine which row in the VROM link 12 to program. In operation, the combination of the column selectors 14 and the row selectors 16 establish an address in the VROM link 12 which is to be programmed.

The polarity control 18 has an output 18A coupled to the transistors 28 and 26, and an inverted output 18B coupled to transistors 24 and 30. The polarity control 18 is used to control the directional flow of a current used in programming the VROM link 12.

Figure 2:
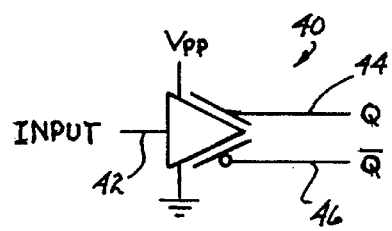
FIG. 2 is a symbolic representation of a level shifter and an input-output logic table for the level shifter used in the circuit depicted in FIG. 1.
Figure 3:
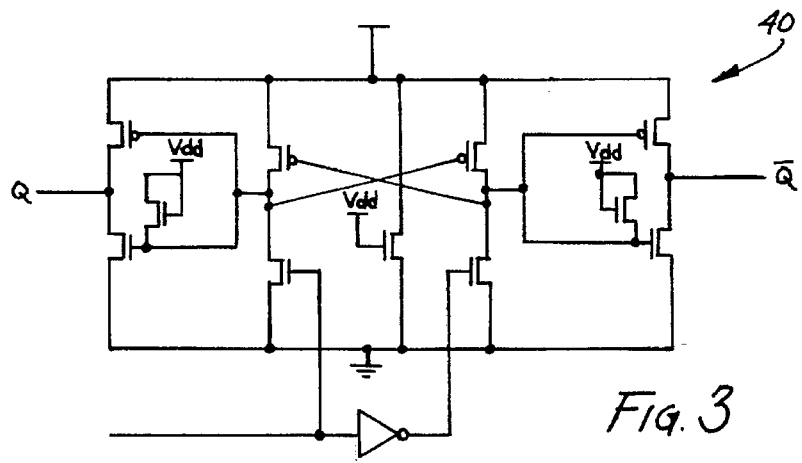
FIG. 3 is a simplified schematic of one embodiment of a level shifter used in the circuit depicted in FIG. 1.

In the preferred embodiment of the present invention, the column selectors 14, the row selectors 16, and the polarity control 18 are level shifters 40 (FIGS. 2–3). FIG. 3 show one embodiment of the level shifter 40. As can be seen from FIG. 2, the level shifter 40 is comprised of an input 42, an output 44, and an inverted output 46. The level shifter 40 is powered by a voltage source $V_{PP}$. In the preferred embodiment of the present invention, the voltage source $V_{PP}$ is set at 10 volts. When the voltage $V_{PP}$ is applied to the level shifter 40, the output 44 will be equal to the voltage $V_{PP}$ when the input 42 to the level shifter 40 is at a high state. The inverted output 46 will be zero when the input signal to the level shifter 40 is at a high state and the voltage $V_{PP}$ is applied. If no voltage $V_{PP}$ is applied to the level shifter 40, the output 44 and the inverted output 46 will both be zero regardless of whether the input signal to the level shifter 40 is at a high or low state.

While the invention has been particularly shown and described with reference to preferred embodiments thereof, it will be understood by those skilled in the art that the foregoing and other changes in form and details may be made therein without departing from the spirit and scope of the invention.

I claim:

1. A system for programming a VROM link comprising, in combination:

a programmable VROM link;

address selection means coupled to said programmable VROM link for selecting an address in said programmable VROM link to program; and polarity control means coupled to said programmable VROM link for controlling directional flow of a current used in programming said programmable VROM link.

2. A system for programming a VROM link in accordance with claim 1 wherein said address selection means further comprises:

column selection means coupled to said programmable VROM link for selecting a column in said programmable VROM link to program; and row selection means coupled to said programmable VROM link for selecting a row in said programmable VROM link to program.

3. A system for programming a VROM link in accordance with claim 2 wherein said column selection means further comprises level shifter means coupled to each column of said programmable VROM link for selecting a column in said programmable VROM link to program.

4. A system for programming a VROM link in accordance with claim 2 wherein said row selection means further comprises level shifter means coupled to each column of said programmable VROM link for selecting a row in said programmable VROM link to program.

5. A system for programming a VROM link in accordance with claim 1 wherein said polarity control means further comprises level shifter means coupled to said programmable VROM link for controlling directional flow of said current used in programming said programmable VROM link.

6. A system for programming a VROM link in accordance with claim 1 wherein said address selection means further comprises level shifter means coupled to each column of said programmable VROM link and coupled to each row of said programmable VROM link for selecting a column and a row in said programmable VROM link to program.

7. A system for programming a VROM link in accordance with claim 6 wherein said polarity control means further comprises said level shifter means coupled to said programmable VROM link for controlling directional flow of said current used in programming said programmable VROM link.

8. A method for programming a VROM link comprising the steps of:

providing a programmable VROM link;

providing address selection means coupled to said programmable VROM link for selecting an address in said programmable VROM link to program;

providing polarity control means coupled to said programmable VROM link for controlling directional flow of a current used in programming said programmable VROM link;

selecting an address in said programmable VROM link to program; and selecting directional flow of said current to program said programmable VROM link.

9. The method of claim 8 wherein said step of providing address selection means further comprises the step of providing level shifter means coupled to each column of said programmable VROM link and coupled to each row of said programmable VROM link for selecting a column and a row in said programmable VROM link to program.

10. The method of claim 9 wherein said step of providing polarity control means further comprises the step of providing said level shifter means coupled to said programmable VROM link for controlling directional flow of said current used in programming said programmable VROM link.

* * * * *